US006927440B2

(12) United States Patent
Greco et al.

(10) Patent No.: US 6,927,440 B2
(45) Date of Patent: Aug. 9, 2005

(54) METAL-INSULATOR-METAL CAPACITOR

(75) Inventors: Nancy Anne Greco, Lagrangeville, NY (US); David Louis Harame, Mohegan Lake, NY (US); Gary Robert Hueckel, Putnam Valley, NY (US); Joseph Thomas Kocis, Pleasant Valley, NY (US); Dominique Nguyen Ngoc, Lake Peeskill, NY (US); Kenneth Jay Stein, Sandy Hook, CT (US)

(73) Assignee: International Business Machines Corporation, Armonk, NY (US)

( * ) Notice: Subject to any disclaimer, the term of this patent is extended or adjusted under 35 U.S.C. 154(b) by 6 days.

(21) Appl. No.: 10/658,036

(22) Filed: Sep. 9, 2003

(65) Prior Publication Data

US 2005/0037568 A1 Feb. 17, 2005

Related U.S. Application Data

(62) Division of application No. 09/318,867, filed on May 26, 1999, now Pat. No. 6,635,527, which is a division of application No. 08/626,310, filed on Apr. 1, 1996, now Pat. No. 5,926,359.

(51) Int. Cl.[7] ........................ H01L 27/108; H01L 29/41
(52) U.S. Cl. ........................................ 257/296; 257/532
(58) Field of Search ........................... 257/68, 71, 288, 257/296, 301, 303, 304, 306, 310, 311, 528, 532; 438/393, 396

(56) References Cited

U.S. PATENT DOCUMENTS

| | | | |
|---|---|---|---|
| 4,335,507 A | 6/1982 | Shibata et al. | |
| 4,786,612 A | 11/1988 | Yau et al. | |
| 4,897,153 A | 1/1990 | Cole et al. | |
| 5,068,694 A | 11/1991 | Ohara | |
| 5,258,096 A | 11/1993 | Maniar | |
| 5,366,920 A | 11/1994 | Yamamichi et al. | |
| 5,392,189 A | * 2/1995 | Fazan et al. | 361/305 |
| 5,407,855 A | 4/1995 | Maniar et al. | |
| 5,407,861 A | 4/1995 | Marangon et al. | |
| 5,436,477 A | 7/1995 | Hashizume et al. | |
| 5,440,174 A | 8/1995 | Nishitsuji | |
| 5,563,762 A | * 10/1996 | Leung et al. | 361/301.4 |
| 5,566,045 A | 10/1996 | Summerfelt et al. | |
| 5,571,746 A | * 11/1996 | Pan | 438/396 |
| 5,625,232 A | 4/1997 | Numata et al. | |
| 5,708,559 A | 1/1998 | Brabazon et al. | |
| 5,736,448 A | 4/1998 | Saia et al. | |
| 5,920,775 A | * 7/1999 | Koh | 438/241 |
| 6,049,103 A | * 4/2000 | Horikawa et al. | 257/303 |

FOREIGN PATENT DOCUMENTS

| | | |
|---|---|---|
| JP | 05299601 | 11/1993 |
| JP | 06140737 | 5/1994 |
| JP | 0750354 | 12/1996 |

OTHER PUBLICATIONS

James McCreary, "Matching Properties and Voltage and Temperature Dependence of MOS Capacitors", IEEE Journal of Solid-State Circuits, Dec. 1981, pp. 608–616, vol. SC–16, No. 6; and.

K. Machida et al., Metal–insulator–Metal Capacitors by Using Electron Cyclotron Resonance Plasma–$SiO_2$, Journal Vacuum Science Technology, B, 13(5), pp. 2013–2015, Sep./Oct. 1995.

* cited by examiner

Primary Examiner—Craig A. Thompson
Assistant Examiner—Jennifer M. Dolan
(74) Attorney, Agent, or Firm—Scully, Scott, Murphy & Presser; Robert M. Trepp, Esq.

(57) ABSTRACT

An interconnection wiring system incorporating two levels of interconnection wiring separated by a first dielectric, a capacitor formed by a second dielectric, a bottom electrode of the lower interconnection wiring or a via and a top electrode of the upper interconnection wiring or a separate metal layer. The invention overcomes the problem of leakage current and of substrate stray capacitance by positioning the capacitor between two levels of interconnection wiring.

4 Claims, 6 Drawing Sheets

METAL-INSULATOR-METAL CAPACITOR

RELATED APPLICATION

This application is a divisional of U.S. application Ser. No. 09/318,867, filed May 26, 1999, now U.S. Pat. No. 6,635,527 which is a divisional of U.S. application Ser. No. 08/626,310, filed Apr. 1, 1996 now U.S. Pat. No. 5,926,359.

FIELD OF THE INVENTION

This invention relates to capacitors formed on electronic devices and more particularly to capacitors formed between interconnection wiring layers on semiconductor chips to form integrated circuits.

BACKGROUND OF THE INVENTION

Various approaches have been tried to form parallel plate capacitors in interconnection wiring by using the metal of two adjacent wiring layers and the interlevel dielectric material between. Another approach has been to form capacitors between the substrate typically of silicon, a dielectric of thermal oxide and a top electrode of polysilicon or metal. These capacitors are especially suited for substrate decoupling capacitors and may be fabricated in the front-end of the line processing.

In the field of analog and mixed signal design, capacitors are required as a passive element in the design of bandpass filters. Analog and mixed signal circuits are designed to operate at higher frequencies than decoupling capacitors to service the wireless communications markets. Decoupling capacitors formed over the substrate or close thereto suffer from capacitive losses to the substrate, resulting in poor bandpass filter operation.

Another problem in forming a stack capacitor in the interconnection wiring layers is that if the capacitor plates are etched at one time by reactive ion etching (RIE) a debris is deposited on the dielectric on the sidewall between the parallel plates causing shorting between the plates.

Another problem has been that when the capacitor plates are not planar and parallel to one another, the capacitor value varies.

It is therefore desirable to form capacitors in the interconnection wiring that are physically isolated from the substrate.

It is further desirable to form capacitors in the interconnection wiring that are inherently reliable via a manufacturing method.

It is further desirable to form capacitors in the interconnection wiring of a semiconductor chip with clean dielectric to dielectric interfaces, free of debris from processing, between the capacitor dielectric and the interlevel wiring dielectric to prevent high leakage currents and shorts and to provide very low leakage currents.

SUMMARY OF THE INVENTION

An interconnection wiring system containing at least one capacitor is described comprising a substrate having a planar upper surface of insulating and conductive regions therein, a first level of interconnection wiring thereover interconnecting the conductive regions, the first level of interconnection wiring further including a patterned region to form the lower electrode of a capacitor, a first dielectric layer formed over the lower electrode, a top electrode formed over the first dielectric layer to form the top electrode of the capacitor, the top electrode having a perimeter interior to the perimeter of the first dielectric layer, a second dielectric layer formed over the first level of interconnection wiring over the first dielectric layer and over the top electrode, the second dielectric layer being substantially thicker than the first level of interconnection wiring, the first dielectric layer and the top electrode, the second dielectric layer having an upper surface and having vias therein filled with conductive material to the upper surface, the vias being in contact with regions of the first level of interconnection wiring and the top electrode, and a second level of interconnection wiring interconnecting the vias.

The invention further provides an interconnection wiring system containing at least one capacitor comprising a substrate having a planar upper surface of insulating and conductive regions therein, a first level of interconnection wiring thereover interconnecting the conductive regions, a first dielectric layer formed over the first level of interconnection wiring, the first dielectric layer having an upper surface and having vias filled with conductive material to the upper surface and in contact with regions of the first level of interconnection wiring, at least one the vias having a patterned region to form the lower electrode of a capacitor, a second dielectric layer formed over the lower electrode and extending beyond the perimeter of the lower electrode, and a second level of interconnection wiring interconnecting the vias filed with conductive material and formed over the second dielectric layer to form the top electrode of the capacitor.

BRIEF DESCRIPTION OF THE DRAWING

These and other features, objects, and advantages of the present invention will become apparent upon consideration of the following detailed description of the invention when read in conjunction with the drawing in which.

DETAILED DESCRIPTION OF THE PREFERRED EMBODIMENTS

Figure 1:
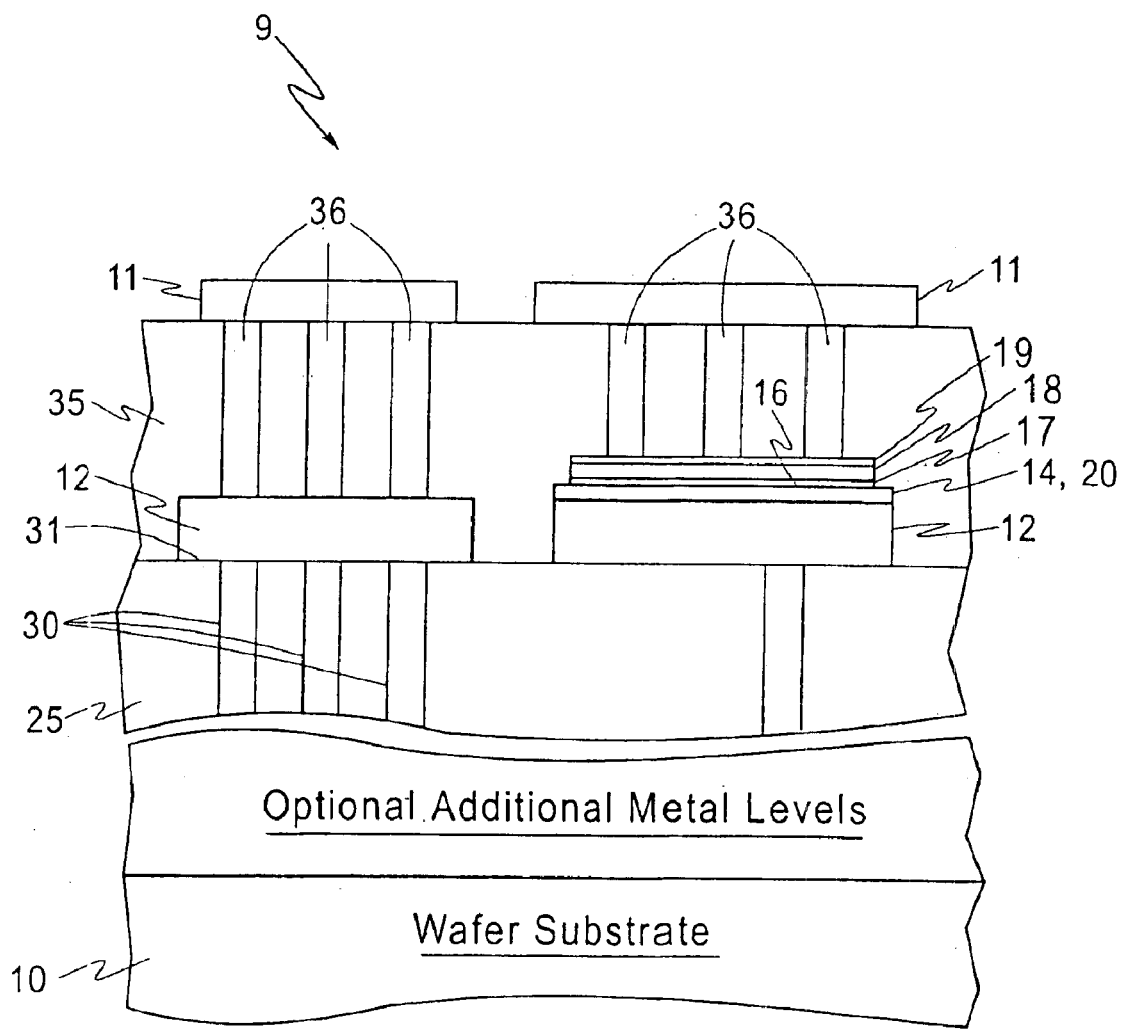
FIG. 1 is a cross-section view of one embodiment of the invention.

Referring to FIG. 1 an interconnection wiring system 9 is shown formed on substrate 10 which may be a semiconductor material such as silicon, silicon germanium, gallium arsenide, etc. containing electronic devices such as n and p channel field effect transistors (not shown). Above substrate 10 may be several layers of interconnection wiring separated by respective layers of dielectric material which may be for example silicon dioxide, spin-on glass, polyimide, diamond-like carbon etc. In FIG. 1, a capacitor 20 is formed between a first level of interconnection wiring 12 and a second level of interconnection wiring 11. Vias 36 electrically connect capacitor 20 to interconnection wiring 11.

First level of interconnection wiring 12 is used as the bottom electrode of capacitor 20. Interconnection wiring 12 is connected to vias 30 below. Vias 30 are formed in dielectric 22 to interconnect conductive regions below (not shown). Vias 30 may have a liner (not shown) and may be filled with tungsten, AlCu, Al2Cu, Cu etc. The upper surface of dielectric layer 22 and vias 30 are polished such as by chemical mechanical polishing to form a coplanar surface 31 of insulating and conductive regions.

Capacitor 20 is composed of the layers: interconnection wiring 12, dielectric layer 14 and an upper or counter electrode 16. The interconnection wiring 12 forming base electrode 12 is generally thicker than layers 14 an 16 and can be represented by any wiring metal layer structure fabricated in a CMOS, PMOS, or NMOS back-end-of-line technology manufactured by, for example, International Business Machines Corporation.

Figure 2:
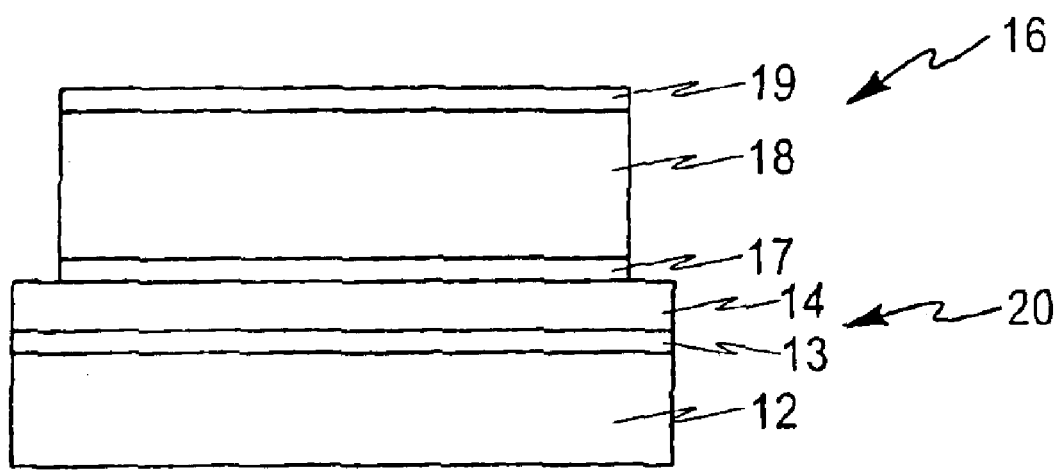
FIG. 2 is an enlarged cross-section view, not to scale, of a portion of FIG. 1 illustrating the capacitor.

Referring to FIG. 2, a detailed view of capacitor 20 is shown. Base electrode 12 comprises a surface layer 13 which is typically used for an anti-reflective coating in subsequent lithographic processing. Surface layer 13 is composed of a metal layer, and is deposited subsequent to the base electrode 12 material. Dielectric layer 14 has a thickness in the range from a few hundred Angstroms to a few thousand Angstroms, depending on the specific application of capacitor 20, its expected operating voltage and the deposition capabilities for the fabrication line to manufacture it. Dielectric layer 14 may be composed of a single or a plurality of layers. The composition and thickness of the single or multiple layers determines the capacitance value of capacitor 20. Layer 16 forming the upper electrode comprises an optional bottom conducting layer 17, a bulk conducting layer 18 and a surface layer 19 formed over layer 18 which is typically used for an anti-reflective coating, similar to surface layer 13 of the base electrode. The optional bottom layer 17 of the upper electrode 16 thickness may be either nonexistent or up to a few hundred Angstroms. The bulk conducting layer 18 may be a few thousand Angstroms thick.

Surface layer 13 may be for example titanium nitride. Dielectric layer 14 may be for example a single silicon dioxide layer a few hundred Angstroms thick. Upper electrode 16 may be prepared with a bottom surface layer 17 composed of titanium nitride a few hundred Angstroms thick. Bulk conducting layer 18 may be a metal and may be for example a few thousand Angstroms thick and upper surface layer 19 may be for example titanium nitride a few hundred Angstroms thick.

Figure 3:
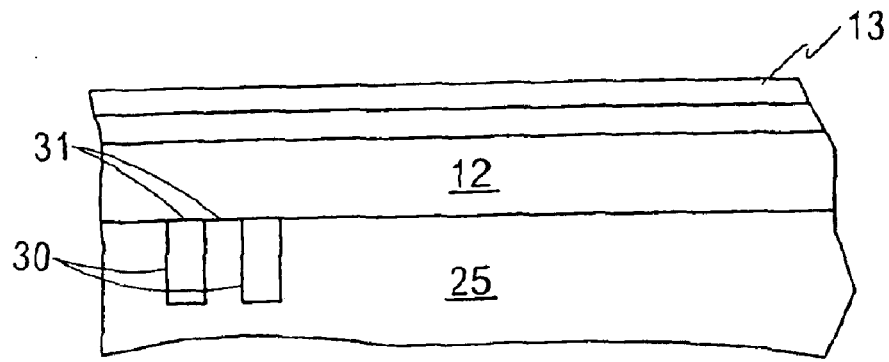
FIGS. 3–11 illustrate various processing steps in the fabrication of an embodiment of the invention similar to FIG. 1.

Referring to FIGS. 3–11, various process steps are shown. In FIG. 3, base electrode 12 is formed on top of interlevel dielectric 25, into which interlevel vias 30 are formed to connect the formed base electrode 12 to the previously defined wiring level which is below (not shown), to the substrate or to transistors or other components (not shown). Base electrode 12 may be the first or nth level of metal wiring. The topology of the wafer is planar. The planarity of the surfaces, and in particular surface 31, is a key attribute in the reliability of capacitor 20. Subsequent dielectric and metal films which are deposited or formed on surface 31 and/or base electrode 12 may have poor conformality properties, yet still be viable candidates as new processes and deposition materials are developed.

Figure 4:
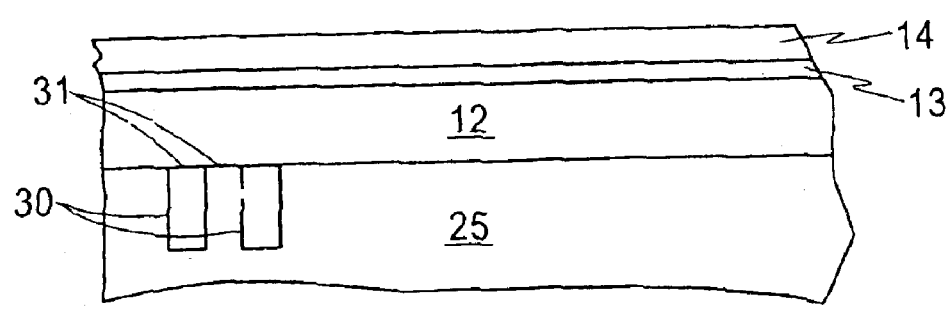

FIG. 4 shows a thin dielectric layer 14 formed over base electrode 12. Dielectric layer 14 may be a single layer of silicon dioxide and formed by plasma-enhanced chemical vapor deposited Tetra-Ethyl Ortho-silicate (PECVD TEOS). The thickness of dielectric layer 14 may be a measured directly on base electrode 12 using conventional ellipsometric tools. The thickness of dielectric layer 14 may be in the range from 60 to 6,000 Angstroms. Other materials may be used for dielectric layer 14 such as silicon nitride, spin-on glass, diamond-like carbon, polyimide etc.

Figure 5:
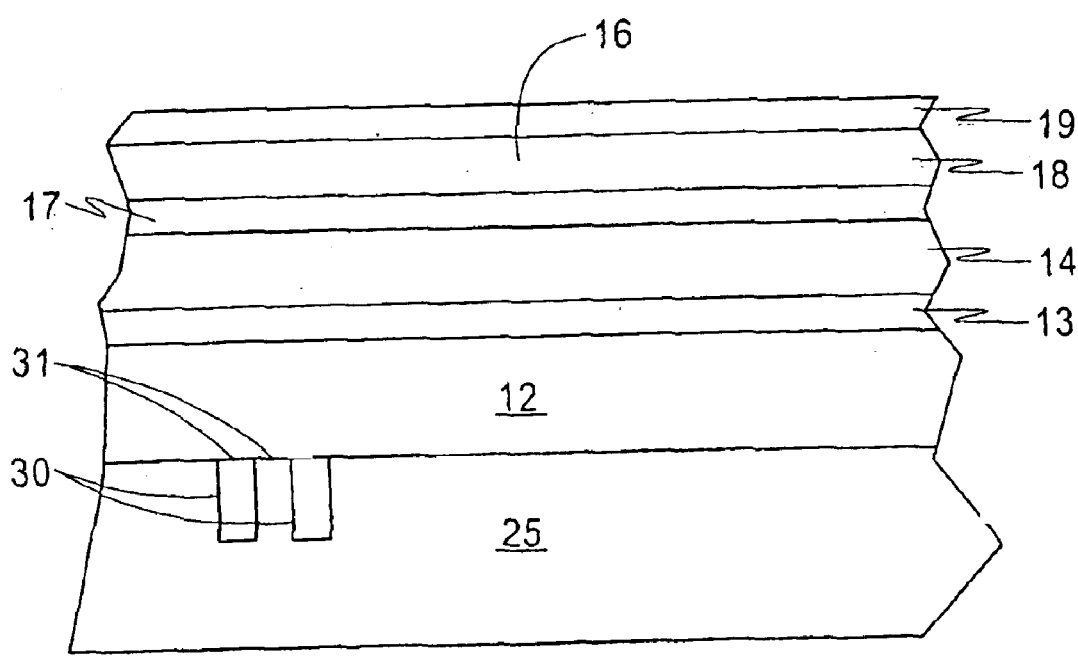

FIG. 5 shows an upper electrode 16 formed over dielectric layer 14. Upper electrode 16 may be for example AlCu alloy metal capped with a titanium nitride anti-reflective coating 19 and an optional bottom layer of titanium nitride 17. A preferred embodiment of this invention is to deposit the upper electrode 16 with a bottom surface layer 17 of titanium nitride a hundred Angstroms thick, and AlCu used for bulk conductor 18 which may be in the range from 500 to 3000 Angstroms thick. Anti-reflective layer 19 of titanium nitride may be for example in the range from about 40 to about 500 Angstroms thick. Layers 17-18 of upper electrode 16 may be deposited in a separate reactor, or in a multi-chamber reactor. A preferred embodiment of this invention is to deposit all upper electrode layers 17-19 in a single multi-chamber reactor typically found in semiconductor fabrication facilities. The presence of the lower surface layer 17 is a key attribute to the reliability of capacitor 20.

Figure 6:
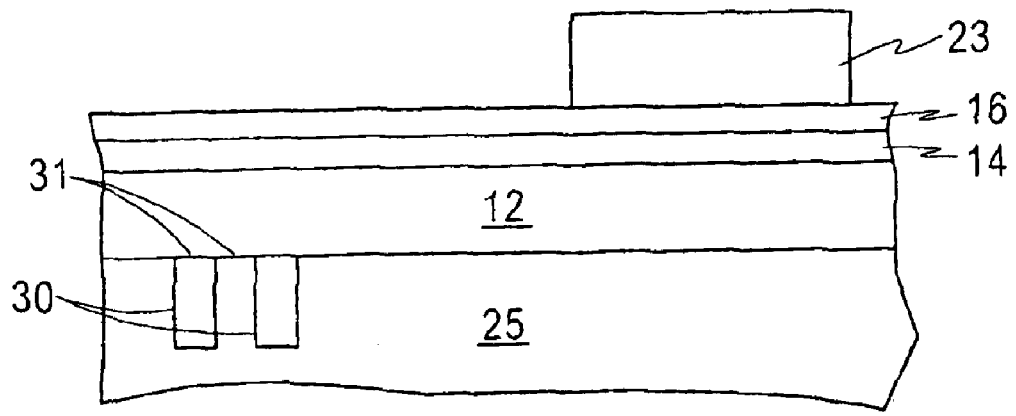
Figure 7:
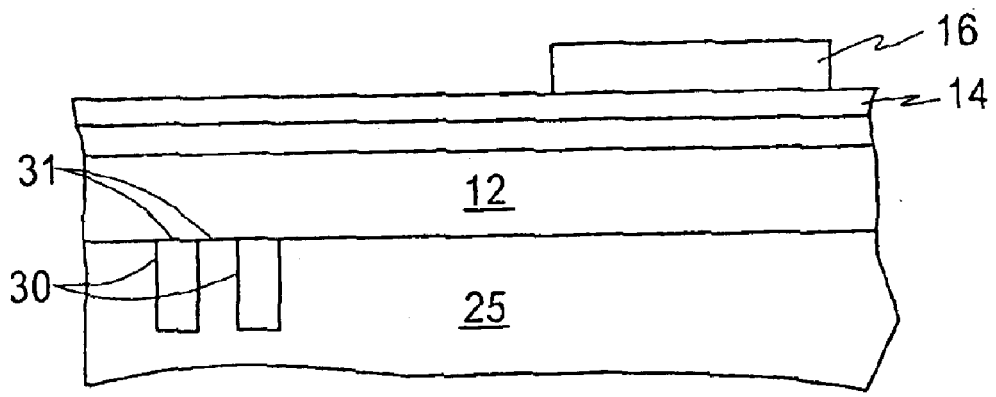

Referring to FIG. 6 a layer of resist 23 is formed over upper electrode 16. Resist 23 is patterned by conventional semiconductor lithography and the pattern is transferred into the upper electrode 16 by subtractive etching the material from the wafer surface as shown in FIG. 7. The only upper electrode 16 material remaining is that which is protected by the lithographic patterned resist 23. In this embodiment, upper electrode material 16 where not protected by resist 23 may be removed by means of reactive ion etching (RIE) Alternatively, wet etching may be used. The lithography pattern is stripped and the substrate is cleaned prior to further processing as shown in FIG. 7. Other etching techniques involving plasma or wet chemical processes may also serve the same end result. A key attribute of this invention is the selectivity of the upper electrode 16 etch with respect to dielectric layer 14. Selective etchants with respect to silicon oxide are well known.

Figure 8:
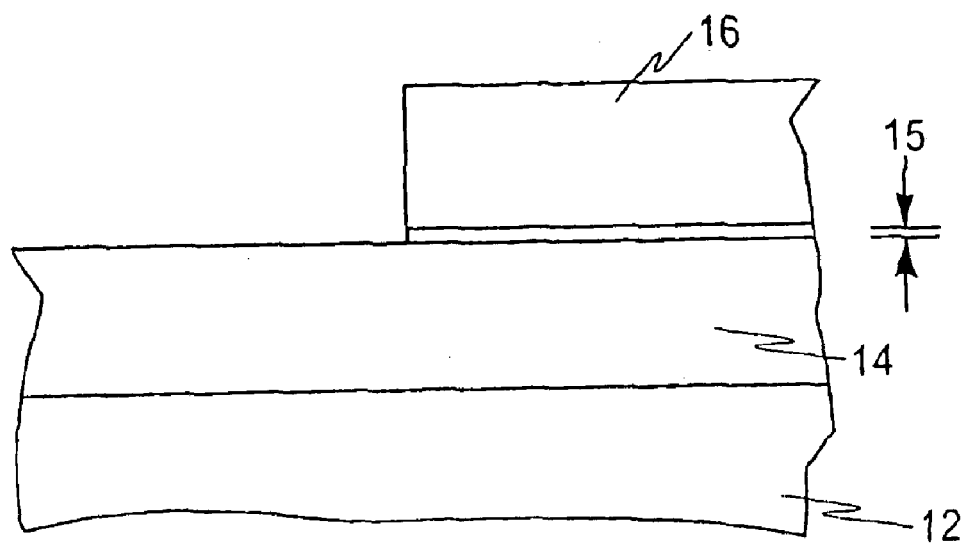

The high reliability of the capacitor 20 is realized by stopping the upper electrode 16 etch in the dielectric layer 14 as shown in FIG. 8. Arrow 15 shows the depth of etching into dielectric layer 14 using a selective etchant. Typical metal plasma RIE processes produce polymers/passivation films during the etch composed of all of the elemental species present during the etch. Should the dielectric 14 be breached (etched through) during the upper electrode 16 etch, these passivating materials will coat the lower electrode 12 and the edge of dielectric 14 and upper electrode 16, creating a natural current leakage path for electrons when capacitor 20 is functional i.e. is storing a charge. The leakage current across the edge of dielectric layer 14 is detrimental to the reliability of capacitor 20.

Figure 9:
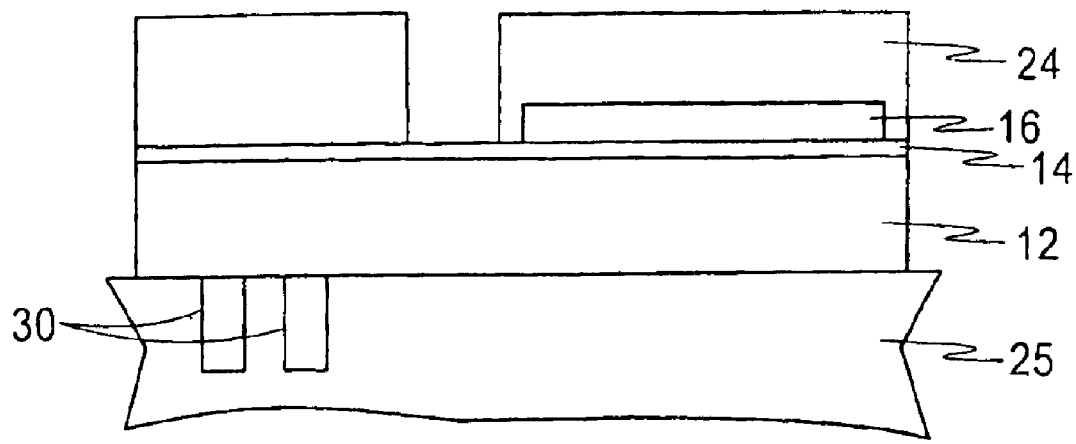
Figure 10:
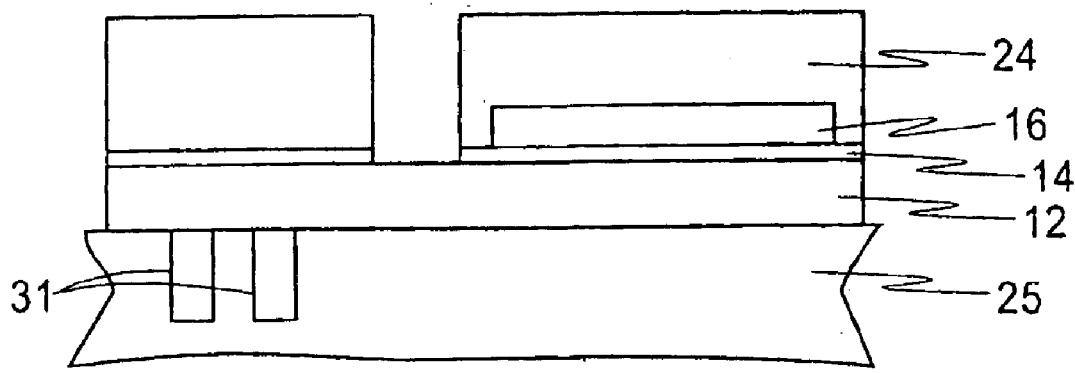
Figure 11:
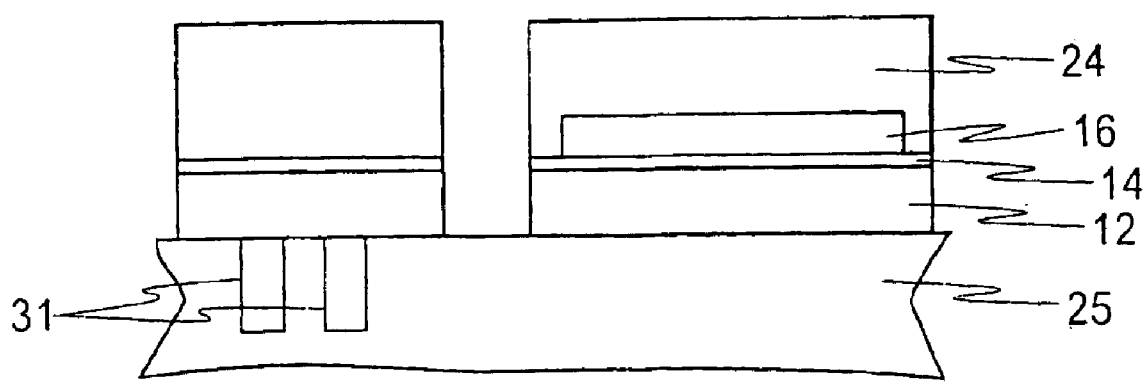

In FIG. 9, the lithographic pattern 24 of developed resist defines the base electrode 12 and the interconnection wiring. A preferred embodiment of the invention is a two step RIE process, where the dielectric 14 is subtractively etched down to the base electrode 12 as shown in FIG. 10. Using the same lithographic pattern, a subsequent subtractive etch is executed to define the base electrode 12 illustrated in FIG. 11. Lithographic pattern 24 is stripped and the substrate is cleaned prior to further processing. Other etching techniques involving plasma or wet chemical processes may also serve the same purpose.

Referring to FIG. 1, additional processing steps including deposition and planarization of an interlevel dielectric 35, defining, etching and metal filling of inter-level vias 36 which connect to wiring layer 12 and upper electrode 16 of capacitor 20. Next, a deposition and definition is made for another level of interconnect wiring 11, which may be the final level or another wiring level, to satisfy functionality of the device.

Figure 12:
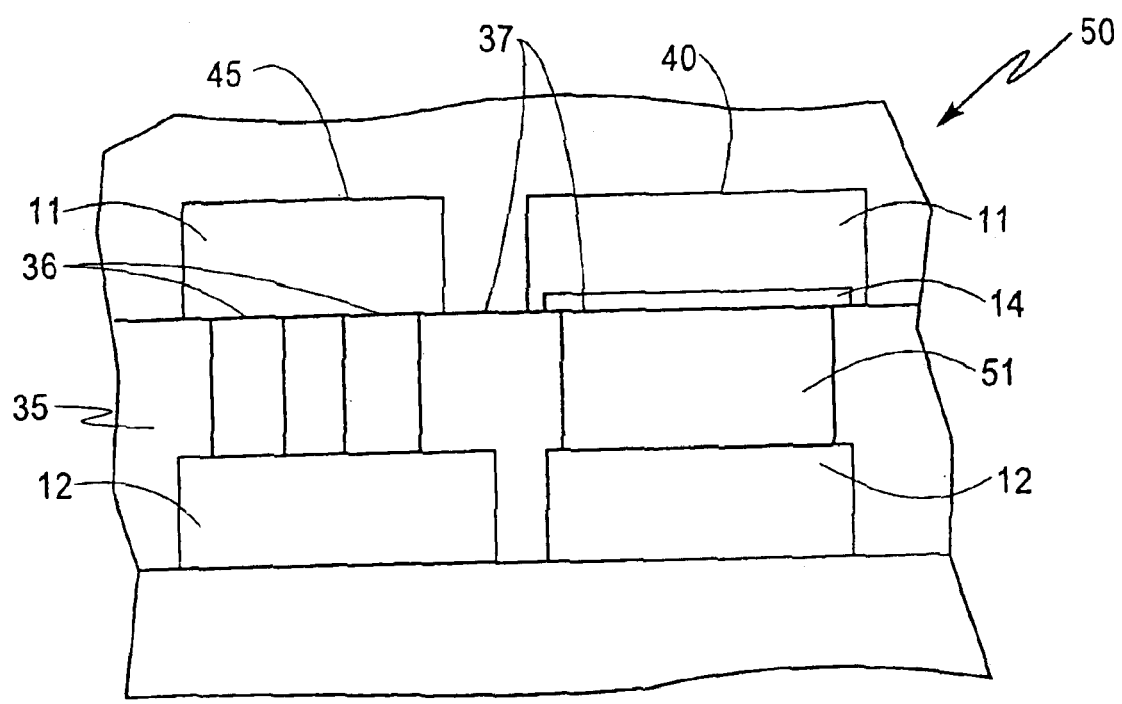
FIG. 12 is a cross-section view of a second embodiment of the invention.

Another practical embodiment of this invention is shown in FIG. 12. In FIG. 12, capacitor 50 is shown in an alternate configuration where the lower electrode 51 above interconnection wiring layer 12 is developed from the interlevel via process. First a dielectric layer 35 is deposited and planarized. Then vias 36 and lower electrode 51 are formed in dielectric layer 35 by opening or drilling holes followed by filling with metal. The upper surface 37 is planarized to form a coplanar surface of vias 36, lower electrode 51 and dielectric layer 35.

As shown in FIG. 12 to make capacitor 50, dielectric 14 is deposited on top of the bottom or lower electrode 51 in a process such as shown in FIG. 4. Dielectric layer 14 covers lower electrode 51 and is defined lithographically for etching. Dielectric layer 14 is etched by time, based on the thickness and film composition. The remaining dielectric 14 must be cleared from the other interlevel vias 36 so as not to impart a high resistance contact to the subsequent wiring level 11. After dielectric 14 is etched, the subsequent metal wiring 11 is deposited, lithographically defined and etched to form both local wiring lines 45 and the upper electrode 40 of capacitor 50. The reliability of capacitor 50 as shown in FIG. 12 is inferior at the present time to the preferred embodiment, described in FIG. 1.

Capacitor devices were tested as shown in FIGS. 1 and 12 at 25 volts at 140° C. for 500 hours and the leakage across the capacitor was monitored continuously. The definition of a failure was when the leakage current of a capacitor became greater than 2×10e−7 Amps at the stress voltage. A capacitor according to FIGS. 1 and 12 with no dielectric overetch, a TEOS dielectric with 450 Angstroms thickness, and a TiN liner provides a capacitor of about a 10 year extrapolated lifetime. A capacitor as above with no TiN liner had a 11% failure rate, 13 failures from 96 capacitors at 0 hours, 2 failures from 81 capacitors during a 500 hour test. A via or stud, dielectric and plate as shown in FIG. 12 with no TiN lining had a 45% failure rate at 0 hours, 38 failures from 96 capacitors, 14 failures from 57 capacitors during a 500 hour test.

While there has been described and illustrated a capacitor device containing a bottom electrode, dielectric and top electrode wherein one electrode is part of the wiring layer and one or more vias are used as the other electrode or to make electrical contact to the other electrode, it will be apparent to those skilled in the art that modifications and variations are possible with out deviating from the broad scope of the invention which shall be limited solely by the scope of the claims appended hereto.

What is claimed is:

1. An interconnection wiring system containing at least one capacitor comprising:
    a substrate having a planar upper surface of insulating and conductive regions therein,
    a first level of interconnection wiring interconnecting said conductive regions,
    a first dielectric layer formed over said first level of interconnection wiring, said first dielectric layer having an upper surface and having visa therein filled with conductive material to said upper surface and in contact with regions of said first level of interconnection wiring, wherein at least one of said vias having dimensions to form said lower electrode of a capacitor and each via, including said lower electrode of said capacitor, has an upper surface that is coplanar to said upper surface of said first dielectric layer,
    a second dielectric layer formed over said lower electrode and extending beyond the perimeter of said lower electrode, and
    a second level of interconnection wiring interconnecting the vias filled with conductive material and formed over the second dielectric layer to form said top electrode of said capacitor.

2. The interconnection wiring system of claim 1 wherein said top electrode has a lower surface of titanium nitride.

3. The interconnection wiring system of claim 1 wherein said lower electrode has an upper surface of titanium nitride.

4. The interconnection wiring system of claim 3 wherein said top electrode has a lower surface of titanium nitride.

* * * * *

UNITED STATES PATENT AND TRADEMARK OFFICE
CERTIFICATE OF CORRECTION

PATENT NO. : 6,927,440 B2
DATED : August 9, 2005
INVENTOR(S) : Nancy A. Greco et al.

It is certified that error appears in the above-identified patent and that said Letters Patent is hereby corrected as shown below:

<u>Column 6,</u>
Line 17, "having visa therein" should read -- having vias therein --.

Signed and Sealed this

Twenty-seventh Day of September, 2005

JON W. DUDAS
*Director of the United States Patent and Trademark Office*